(12) United States Patent
Lee et al.

(10) Patent No.: US 7,852,140 B2
(45) Date of Patent: Dec. 14, 2010

(54) INTERNAL VOLTAGE GENERATION CIRCUIT AND METHOD THEREOF

(75) Inventors: Do-Yun Lee, Gyeonggi-do (KR); Hong-Gyeom Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 12/346,808

(22) Filed: Dec. 30, 2008

(65) Prior Publication Data

US 2010/0033234 A1 Feb. 11, 2010

(30) Foreign Application Priority Data

Aug. 8, 2008 (KR) ...................... 10-2008-0078100
Nov. 13, 2008 (KR) ...................... 10-2008-0112710

(51) Int. Cl.
*G05F 1/10* (2006.01)
*G05F 3/02* (2006.01)

(52) U.S. Cl. ....................... 327/536; 327/535; 327/537; 363/60

(58) Field of Classification Search ................. 327/148, 327/157, 534–537; 363/59, 60; 331/57
See application file for complete search history.

(56) References Cited

U.S. PATENT DOCUMENTS

| | | | |
|---|---|---|---|
| 6,194,954 B1 * | 2/2001 | Kim et al. | 327/535 |
| 6,278,317 B1 * | 8/2001 | Hsu et al. | 327/536 |
| 6,320,457 B1 * | 11/2001 | Yang | 327/536 |
| 2006/0273844 A1 * | 12/2006 | Lee | 327/536 |

FOREIGN PATENT DOCUMENTS

KR 1020050052634 A 6/2005

OTHER PUBLICATIONS

Notice of Preliminary Rejection issued from Korean Intellectual Property Office on Aug. 28, 2009 with an English Translation.

* cited by examiner

*Primary Examiner*—Lincoln Donovan
*Assistant Examiner*—Brandon S Cole
(74) *Attorney, Agent, or Firm*—IP & T Group LLP

(57) ABSTRACT

An internal voltage generation circuit includes a level detection unit configured to generate a detection voltage corresponding to a voltage level difference between a reference voltage with an internal voltage, an oscillation signal generation unit configured to generate an oscillation signal having a period corresponding to a voltage level of the detection voltage, and an internal voltage generation unit configured to generate the internal voltage in response to the oscillation signal.

8 Claims, 3 Drawing Sheets

INTERNAL VOLTAGE GENERATION CIRCUIT AND METHOD THEREOF

CROSS-REFERENCES TO RELATED APPLICATION

The present invention claims priority of Korean patent application numbers 10-2008-0078100 and 10-2008-0112710, filed on Aug. 8, 2008, and Nov. 13, 2008, which are incorporated by reference in their entirety.

BACKGROUND OF THE INVENTION

The present invention relates to a semiconductor design technology; and more particularly, to an internal voltage generation circuit for generating an internal voltage.

In general, an internal voltage generation circuit is mounted on a semiconductor device, i.e., a Double Date Rate Synchronous DRAM (DDR SDRAM). The semiconductor consumes power efficiently and executes a more stable circuit operation by using an internal voltage of various voltage levels. A peripheral voltage and a core voltage as an internal voltage are generated by down-converting an external power voltage. A pumping voltage and a substrate bias voltage as an internal voltage are generated by pumping the external power voltage and a ground power voltage.

Meanwhile, as a semiconductor device is integrated highly, a design-rule below a sub-micron level is applied to design of an internal circuit, and an operation frequency of the semiconductor device is getting higher. An external power voltage must be basically lowered for the microcircuits to perform a high frequency operation. Thus, nowadays, researchers endeavor to generate stable internal voltage using a lowered external power voltage. Especially, because a pumping voltage, which is generated by pumping the external power voltage, can be largely varied in response to a micro variation of the external power voltage, it is noted to design the pumping voltage generation circuit for generating a pumping voltage.

Moreover, the pumping voltage is used in various circuits, e.g., a memory cell, of a semiconductor device. The memory cell for storing data is configured to have one cell transistor and one cell capacitor. The pumping voltage is applied to a gate terminal of the cell transistor. Because the cell transistor performs a function of a transmission path between a bit line and the cell capacitor, if the pumping voltage is unstable, the data stored in the cell capacitor from the bit line, or the data outputted from the cell capacitor to the bit line cannot be transmitted stably. That is, the pumping voltage is an important element to store or output the data stably.

FIG. 1 is a block diagram illuminating a conventional pumping voltage generation circuit.

Referring to FIG. 1, a pumping voltage generation circuit includes a comparison unit 110, an oscillation unit 130 and a pumping unit 150. If a pumping voltage VPP that is finally generated is lower than a target voltage level, the pumping voltage generation circuit raises the pumping voltage to the target voltage level by performing a pumping operation. If the pumping voltage is higher than the target voltage level, the pumping voltage generation unit does not perform the pumping operation.

The comparison unit 110 compares a reference voltage VREF with the pumping voltage VPP that is fed back, and generates an enable signal EN_OSC for enabling the oscillation unit. The reference voltage VREF has a voltage level corresponding to the target voltage level. The enable signal EN_OSC has a logical level value of logic 'high' or 'low' based on the comparison result of the reference voltage VREF and the pumping voltage VPP.

The oscillation unit 130 generates an oscillation signal OSC having a predetermined period in response to the enable signal EN_OSC. When it is assumed that if the pumping voltage VPP is lower than the reference voltage VREF, the comparison unit 110 outputs an enable signal EN_OSC of a logic 'high', and if the pumping voltage VPP is higher than the reference voltage VREF, the comparison unit 110 outputs an enable signal EN_OSC of a logic 'low', the oscillation unit 130 generates an oscillation signal OSC having a predetermined period in response to the enable signal EN_OSC of the logic 'high' and generates an oscillation signal OSC which is not oscillated in response to the enable signal EN_OSC of a logical 'low'.

The pumping unit 150 generates the pumping voltage VPP corresponding to the oscillation signal OSC. Thus, if the pumping voltage is lower than the target voltage level, the pumping unit 150 generates the pumping voltage VPP by performing the pumping operation according to the predetermined period of the oscillation signal OSC. If the pumping voltage VPP is raised to the target voltage level through the pumping operation, the pumping unit 150 is disabled and the pumping operation of the pumping unit 150 stops. The pumping voltage generation circuit generates the pumping voltage VPP corresponding to the target voltage level and higher than an external power voltage through the operation of the components in the pumping voltage generation circuit.

Moreover, the pumping voltage VPP must be maintained to the target voltage level, but the voltage level of the pumping voltage is lower than the target voltage level in an operation which consumes a lot of the pumping voltage. The lowered pumping voltage VPP performs the pumping operation in response to the oscillation signal OSC, which has a predetermined period and is fed back to the target voltage level. That is, the pumping operation is performed in response to the predetermined period of the oscillation signal.

Here, the period of the oscillation signal OSC is determined based on various components such as a circuit operation or power consumption. This is because if the period of the oscillation signal OSC is designed to be short, unnecessary power consumption can occur, and if the period of the oscillation signal OSC is designed to be too long, it is difficult to feed back the pumping voltage to the target voltage level. Thus, a designer determines the oscillation signal OSC based on all conditions and designs the oscillation unit 130 in response to the period of the oscillation signal.

However, it is difficult to optimize the oscillation signal having the predetermined period to satisfy the circuit operation and the power consumption. That is, if the period of the oscillation signal OSC is small to increase the pumping operation speed, the unnecessary power consumption occurs, and if the period of the oscillation signal OSC is large to reduce the power consumption, the pumping operation slows down.

SUMMARY OF THE INVENTION

Embodiments of the present invention are directed to providing an internal voltage generation circuit for generating an oscillation signal having a period corresponding to a voltage level different between a reference voltage and an internal voltage, and generating an internal voltage in response to the oscillation signal.

In accordance with an aspect of the present invention, there is provided an internal voltage generation circuit includes: a level detection unit configured to generate a detection voltage corresponding to a voltage level difference between a reference voltage with an internal voltage; an oscillation signal generation unit configured to generate an oscillation signal having a period corresponding to a voltage level of the detection voltage; and an internal voltage generation unit configured to generate the internal voltage in response to the oscillation signal.

In accordance with an aspect of the present invention, there is provided a internal voltage generation method, including: generating an internal voltage corresponding to an oscillation signal; and adjusting a period of the oscillation signal in response to a voltage level difference between a reference voltage and the internal voltage.

The present invention generates an oscillation signal having a period corresponding to a voltage level different between a reference voltage and an internal voltage. The internal voltage generation circuit in accordance with the present invention feeds back an internal voltage rapidly, which is lower than a target voltage level, with an optimum power consumption using the oscillation signal.

DESCRIPTION OF SPECIFIC EMBODIMENTS

Hereafter, an internal generation circuit of a semiconductor memory device in accordance with the present invention will be described in detail with reference to the accompanying drawings.

Figure 1:
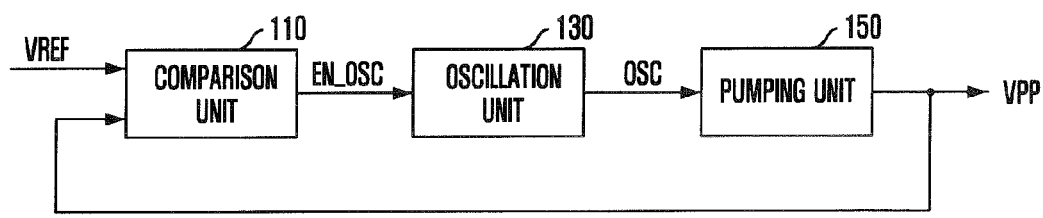
FIG. 1 is a block diagram illuminating a conventional pumping voltage generation circuit.
Figure 2:
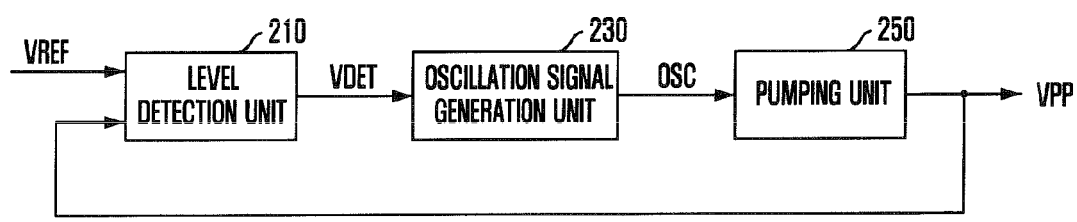
FIG. 2 is a block diagram illustrating a pumping voltage generation circuit in accordance with an embodiment of the present invention.

FIG. 2 is a block diagram illustrating a pumping voltage generation circuit in accordance with an embodiment of the present invention.

Referring to FIG. 2, a pumping voltage generation circuit includes a level detection unit 210, an oscillation signal generation unit 230 and a pumping unit 250. If a pumping voltage VPP that is finally generated from the pumping voltage generation circuit is lower than a target voltage level, the voltage pumping voltage generation circuit in accordance with the present invention raises the pumping voltage VPP to the target voltage level by performing a pumping operation. If a pumping voltage VPP that is finally generated from the pumping voltage generation circuit is higher than a target voltage level, the voltage pumping voltage generation circuit does not perform the pumping operation. Then, the pumping voltage generation circuit in accordance with the present invention is capable of performing the pumping operation in a period corresponding to a voltage level difference between a reference voltage VREF and the pumping voltage VPP. Details description will be described as below.

The level detection unit 210 generates a detection voltage VDET corresponding to the voltage level difference between the reference voltage VREF and the pumping voltage VPP. The detection voltage VDET has a voltage level corresponding to the voltage level difference between the reference voltage VREF and the pumping voltage VPP and controls an enable operation of the oscillation signal generation unit 230.

Figure 3:
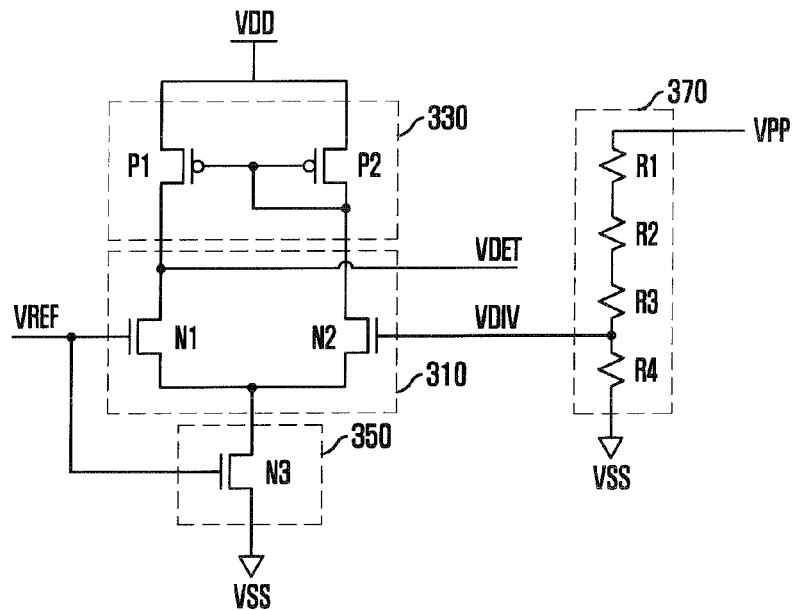
FIG. 3 is a circuit diagram illustrating a level detection unit shown in FIG. 2.

FIG. 3 is a circuit diagram illustrating a level detection unit 210 shown in FIG. 2.

Referring to FIG. 3, the level detection unit 210 includes an input unit 310, a power supply unit 330, an enable unit 350 and a voltage-dividing unit 370.

The input unit 310 receives the reference voltage VREF and a divided voltage VDIV into which the pumping voltage VPP is divided. A source-drain path is formed between the power supply unit 330 and the enable unit 350. The input unit has a first NMOS transistor N1 and a second NMOS transistor N2, which receive the reference voltage VREF and the divided voltage VDIV, respectively.

The power supply unit 330 supplies a power to an output terminal in response to the divided voltage VDIV and the reference voltage VREF inputted to the input unit 310. The power supply unit 330 has first and second PMOS transistors having a source-drain path that is formed between the input unit 310 and an external power voltage VDD. A gate of the first and second PMOS transistors P1 and P2 can be coupled to an opposite node of an output terminal, which outputs the detection voltage VDET.

The enable unit 350 enables the input unit 310 in response to the reference voltage VREF. The enable unit 350 has a source-drain path which is coupled between the input unit 310 and a ground power voltage VSS. The enable unit 350 has a third NMOS transistor N3 that receives the reference voltage through a gate.

The voltage-dividing unit 370 generates a divided voltage VDIV into which the pumping voltage VPP is divided and inputs the divided voltage to the input unit 310. The voltage-dividing unit 370 has first to fourth resistors R1, R2, R3 and R4 which are coupled between the pumping voltage VPP and the ground power voltage VSS. The first to fourth resistors R1, R2, R3 and R4 can be designed differently based on the reference voltage VREF and the target voltage level. For example, resistance values of the first to fourth resistors can be designed to be same with one another. If the reference voltage VREF is set to 0.8V, the target voltage level can be defined as 3.2V.

Hereafter, an operation of the oscillation signal generation unit 230 will be described. For the convenience of the description, it is assumed that the reference voltage VREF is set to 0.8V, and the target voltage level is set to 3.2V.

Firstly, in case that the pumping voltage is lower than a target voltage level, the divided voltage VDIV has a voltage level lower than the reference voltage VREF of 0.8V. Accordingly, a turn-on level of the first NMOS transistor N1 is larger than a turn-on level of the second NMOS transistor, and a voltage level of the detection voltage VDET is lowered. The voltage level of the detection voltage depends on the voltage level difference between the reference voltage VREF and the divided voltage VDIV. That is, since the divided voltage to the reference voltage is lowered, the turn-on level of the first NMOS transistor N1 increases and the voltage level of the detection voltage VDET is lowered.

As mentioned above, the divided voltage VDIV is coupled to the pumping voltage VPP. That is, the voltage level of the detection voltage VDET is changed in response to the voltage level difference between the pumping voltage VPP and the reference voltage VREF.

On the contrary, in case that the pumping voltage VPP is higher than the target voltage level, the divided voltage VDIV has a voltage level higher than the reference voltage VREF of 0.8V. Accordingly, a turn-on level of the second NMOS transistor N2 is larger than a turn-on level of the first NMOS transistor, and a voltage level of the detection voltage VDET increases. The detection voltage having an analog characteristic enables the oscillation signal generation to sensitively operate in response to the voltage level variation of the pumping voltage VPP.

Referring to FIG. 2, the oscillation signal generation unit 230 generates an oscillation signal OSC having a period corresponding to the voltage level of the detection voltage VDET. The oscillation signal OSC can have a period corresponding to the voltage level difference between the reference voltage VREF and the pumping voltage VPP as the internal voltage.

Figure 4:
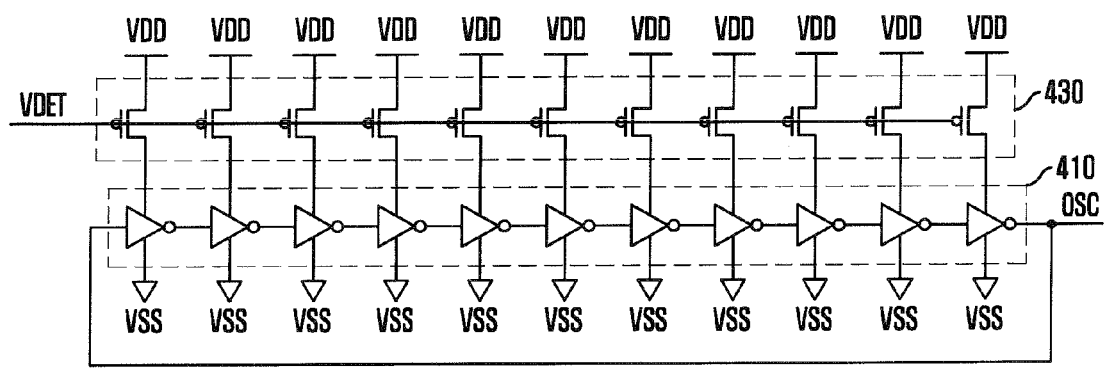
FIG. 4 is a circuit diagram illustrating an oscillation signal generation unit shown in FIG. 2.

FIG. 4 is a circuit diagram illustrating an oscillation signal generation unit 230 shown in FIG. 2.

Referring to FIG. 4, the oscillation signal generation unit 230 includes an oscillation unit 410 and a current adjustment unit 430.

The oscillation unit 410 generates an oscillation signal OSC and has a plurality of inverters. If a driving current of the plurality of inverters is uniformly maintained, the oscillation unit 410 generates an oscillation signal OSC having a predetermined period. In the present invention, the oscillation signal OSC can be generated with a period corresponding to the driving current by controlling the driving current of the oscillation unit 410.

The current adjustment unit 430 adjusts the driving current applied to the oscillation unit 410 in response to the detection voltage VDET. A source-drain path is formed between the external power voltage VDD and each of the plurality of inverters. The current adjustment unit 430 can have a plurality of PMOS transistors that receive the detection voltage through a gate. The number of the PMOS transistors included in the current adjustment unit 430 can be changed according to a design. Moreover, the current adjustment unit 430 can be coupled between the oscillation unit 410 and the ground power voltage VSS according to the design.

Hereafter, an operation of the oscillation signal generation unit 230 will be described as below.

Firstly, in case that the plurality of PMOS transistors of the current adjustment unit 430 are turned off in response to the detection voltage VDET, that is, the oscillation signal generation unit 230 is disabled, the oscillation unit 410 does not perform an oscillation operation because the oscillation unit 410 does not receive the driving current from the current adjustment unit 430. It is preferred that the oscillation signal OSC has a predetermined logical level value. It can be implemented that the oscillation signal OSC has the predetermined logical level value by adding a simple logic.

Next, in case that the plurality of PMOS transistors of the current adjustment unit 430 are turned on in response to the detection voltage VDET, that is, the oscillation signal generation unit 230 is enabled, the plurality of PMOS transistors are differently turned on in response to the voltage level of the detection voltage VDET, and a driving current applied to the oscillation unit 410 is varied in response to the turn-on level of the plurality of PMOS transistors. That is, if the turn-on level of the plurality of PMOS transistors is large, the driving current applied to the oscillation unit 410 increases. On the contrary, if the turn-on level of the plurality of PMOS transistors is small, the driving current applied to the oscillation unit 410 decreases.

To adjust the driving current applied to the oscillation unit 410 denotes that a period of the oscillation signal OSC generated from the oscillation unit 410 is varied. That is, if the driving current applied to the oscillation unit 410 increases, the period of the oscillation signal decreases as much as the increasing quantity of the driving current, if the driving current of the oscillation unit 410 is small, the period of the oscillation signal increases as much as the decreasing quantity of the driving current. That is, the period of the oscillation signal OSC is corresponding to the voltage level of the detection voltage VDET.

As described above, the detection voltage VDET has the voltage level corresponding to the voltage level difference between the pumping voltage VPP and the reference voltage VREF. Finally, the period of the oscillation signal OSC in accordance with the present invention can be corresponding to the voltage level difference between the reference voltage VREF and the pumping voltage VPP.

Referring to FIG. 2, the pumping unit 250 for generating the internal voltage can generate the pumping voltage VPP in response to the generated oscillation signal OSC. The pumping unit 250 performs a pumping operation in response to the period of the oscillation signal OSC.

Figure 5:
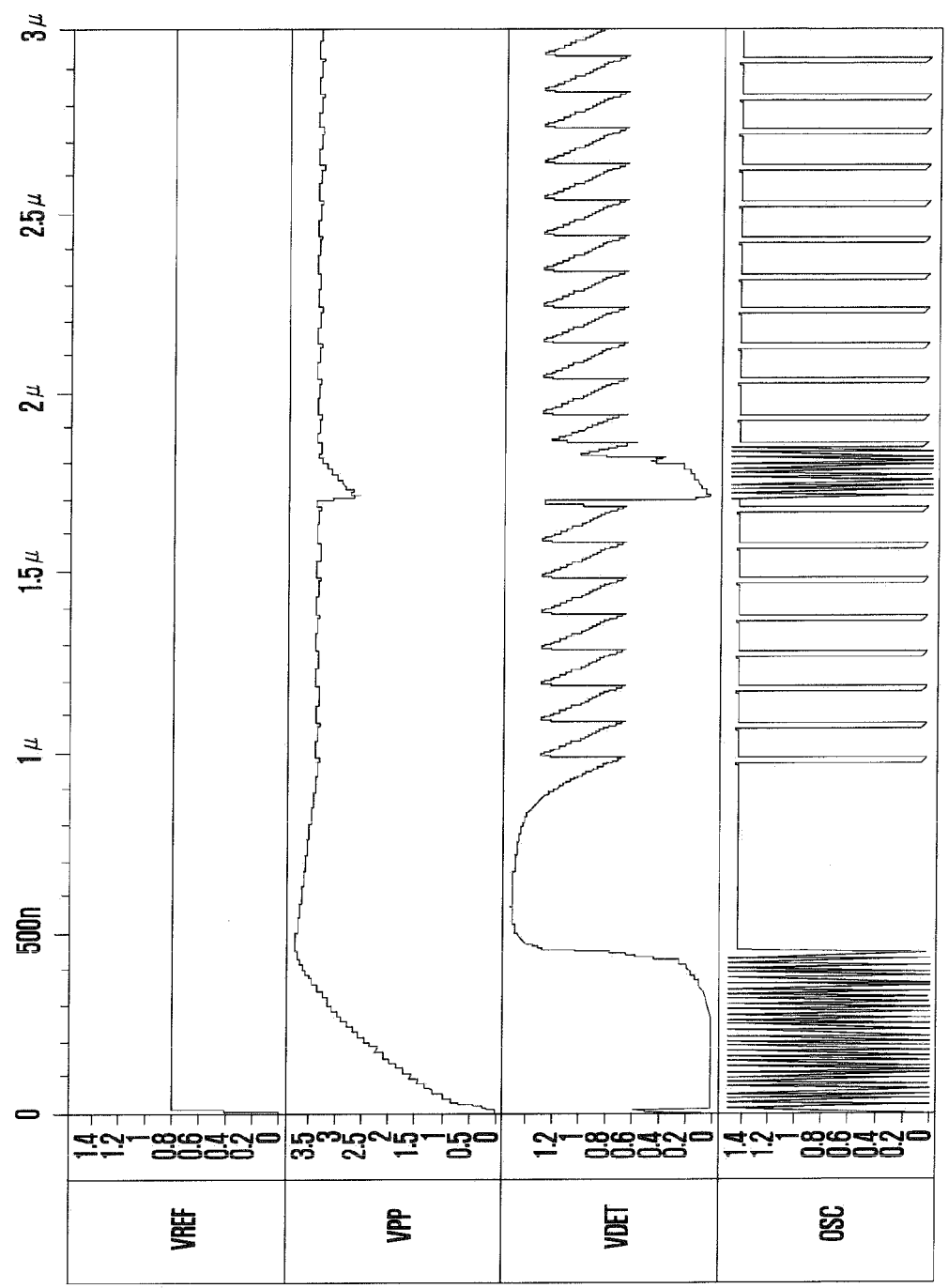
FIG. 5 is a waveform diagram illustrating an operation waveform of a pumping voltage generation circuit in accordance with an embodiment of the present invention.

FIG. 5 is a waveform diagram illustrating an operation waveform of a pumping voltage generation circuit in accordance with an embodiment of the present invention. The reference voltage VREF, the pumping voltage VPP, the detection voltage VDET and the oscillation signal OSC are shown in FIG. 5.

As shown in FIG. 5, in case that the pumping voltage VPP has a voltage level corresponding to the target voltage level, the detection voltage VDET maintains a predetermined voltage level. In case that the pumping voltage VPP is lowered little or much than the target voltage level, the detection voltage VDET has a voltage level corresponding to the voltage level difference between the pumping voltage VPP and the reference voltage VREF, and the oscillation signal OSC has a period corresponding to the voltage level. The period of the oscillation signal OSC is coupled to the pumping operation and raises the pumping voltage VPP.

Finally, if the pumping voltage VPP is lowered little than the target voltage level, the pumping voltage generation circuit in accordance with the present invention generates the oscillation signal OSC having a large period and reduces unnecessary power consumption. If the pumping voltage VPP is lowered much than the target voltage level, the pumping voltage generation circuit in accordance with the present invention generates the oscillation signal OSC having a small period and feedbacks the lowered pumping voltage VPP to the target voltage level rapidly.

Moreover, the pumping voltage VPP in accordance with the present invention improve the stability of the data transmission of a data line and a cell capacitor by stably controlling a gate of the cell transistor.

Moreover, in an embodiment of the present invention mentioned above, to generate the pumping voltage VPP is described as an embodiment, but the present invention can be applied to a case that and another internal voltage is generated or a substrate bias voltage is generated using an oscillation signal except the pumping voltage VPP.

Furthermore, a logical gate and a transistor described in the embodiment of the present invention can be implemented at a different position and sort based on a polarity of an input signal.

The present invention can acquire a stable internal voltage and optimize a power consumed by rapidly feeding back an internal voltage lower than a target voltage level.

Moreover, the present invention can improve a circuit operation speed by being sensitively operated in response to a voltage level variation of the internal voltage.

Furthermore, the present invention can improve the stability of data transfer by generating a pumping voltage stably.

While the present invention has been described with respect to the specific embodiments, it will be apparent to those skilled in the art that various changes and modifications may be made without departing from the spirit and scope of the invention as defined in following claims.

What is claimed is:

1. An internal voltage generation circuit, comprising:
   a level detection unit configured to generate a detection voltage that increases or decreases proportionally to a voltage level difference between a reference voltage and an internal voltage;
   an oscillation signal generation unit configured to generate an oscillation signal having a period that increases or decreases proportionally to a voltage level of the detection voltage; and
   an internal voltage generation unit configured to generate the internal voltage in response to the oscillation signal,
   wherein the detection voltage is an analog voltage that changes continuously as the voltage level difference between the reference voltage and the internal voltage changes and wherein the level detection unit includes:
      an input unit configured to receive the reference voltage and the internal voltage; and
      a power supply unit connected between a power voltage terminal and the input unit and configured to supply a power to an output terminal in response to the internal voltage and the reference voltage.

2. The internal voltage generation circuit of claim 1 wherein the level detection unit further includes:
   a voltage divider unit configured to divide the internal voltage and input the divided internal voltage to the input unit; and
   an enable unit configured to enable the input unit in response to the reference voltage.

3. The internal voltage generation circuit of claim 1, wherein the oscillation signal generation unit includes:
   an oscillation unit configured to generate the oscillation signal; and
   a current adjusting unit configured to adjust a driving current applied to the oscillation unit in response to the detection voltage.

4. The internal voltage generation circuit of claim 1, wherein the internal voltage generation unit is configured to perform a pumping operation to generate the internal voltage, in response to the oscillation signal.

5. An internal voltage generation method, comprising:
   generating an internal voltage in response to an oscillation signal;
   generating a detection voltage that increases or decreases proportionally to the voltage level difference between a reference voltage and the internal voltage; and
   increasing or decreasing a period of the oscillation signal proportionally to a voltage level of the detection voltage,
   wherein the detection voltage is an analog voltage that changes continuously as the voltage level difference between the reference voltage and the internal voltage changes and wherein the detection voltage is generated by a level detection unit which includes:
      an input unit configured to receive the reference voltage and the internal voltage; and
      a power supply unit connected between a power voltage terminal and the input unit and configured to supply a power to an output terminal in response to the internal voltage and the reference voltage.

6. The internal voltage generation method of claim 5, wherein generating the detection voltage includes:
   dividing the internal voltage and generating a divided voltage; and
   comparing the divided voltage with the reference voltage to obtain the voltage level difference.

7. The internal voltage generation method of claim 5, wherein the oscillation signal has a period corresponding to a driving current that is adjusted in response to the voltage level of the detection voltage.

8. The internal voltage generation method of claim 5, wherein generating the internal voltage performs a pumping operation in response to the period of the oscillation signal.

* * * * *